United States Patent
Nakata

(10) Patent No.: US 8,295,511 B2
(45) Date of Patent: Oct. 23, 2012

(54) AUDIO SYSTEM

(75) Inventor: Kazuhiro Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1580 days.

(21) Appl. No.: 11/596,682

(22) PCT Filed: Jun. 15, 2005

(86) PCT No.: PCT/JP2005/010969
§ 371 (c)(1),
(2), (4) Date: Nov. 16, 2006

(87) PCT Pub. No.: WO2006/027881
PCT Pub. Date: Mar. 16, 2006

(65) Prior Publication Data
US 2008/0192958 A1    Aug. 14, 2008

(30) Foreign Application Priority Data
Sep. 3, 2004 (JP) ................................. 2004-257396

(51) Int. Cl.
*H03G 3/00* (2006.01)
(52) U.S. Cl. .............. 381/107; 381/28; 455/3.1; 455/6.3
(58) Field of Classification Search .................. 381/11, 381/12, 28, 77, 79, 309, 311, 107; 455/3.1, 455/6.1–6.3, 575.2, 575.5
See application file for complete search history.

(56) References Cited

U.S. PATENT DOCUMENTS

| | | | |
|---|---|---|---|
| 5,361,394 A * | 11/1994 | Shigihara | 725/131 |
| 5,404,315 A * | 4/1995 | Nakano et al. | 381/102 |
| 5,519,641 A * | 5/1996 | Beers et al. | 709/208 |
| 5,666,424 A * | 9/1997 | Fosgate et al. | 381/18 |
| 5,706,357 A * | 1/1998 | Yang | 381/107 |
| 6,826,286 B1 * | 11/2004 | Arndt et al. | 381/312 |
| 6,868,162 B1 * | 3/2005 | Jubien et al. | 381/107 |
| 7,418,304 B2 * | 8/2008 | Kim et al. | 700/94 |
| 7,706,552 B2 * | 4/2010 | Uehara et al. | 381/106 |
| 2004/0091123 A1 * | 5/2004 | Stark et al. | 381/86 |

FOREIGN PATENT DOCUMENTS

| | | |
|---|---|---|
| JP | 6-37563 A | 2/1994 |
| JP | 9-186540 A | 7/1997 |
| JP | 10-282992 A | 10/1998 |
| JP | 10-335960 A | 12/1998 |
| JP | 2001-320793 A | 11/2001 |
| JP | 2003-348682 A | 12/2003 |

* cited by examiner

*Primary Examiner* — Vivian Chin
*Assistant Examiner* — Friedrich W Fahnert
(74) *Attorney, Agent, or Firm* — Birch, Stewart, Kolasch & Birch, LLP

(57) ABSTRACT

An audio system 10 has a plurality of audio sources 12a-12c for outputting audio signals different from each other. A coefficient device 15d adjusts the gain of the audio signal output from one of the audio sources. A nonvolatile memory 15i stores, as internal gains, gains to be set to the coefficient device in correspondence with the audio sources. When a switch changeover section 17 selects one of the audio sources, the CPU 15h reads from the nonvolatile memory the internal gain corresponding to the audio source selected, and sets the internal gain to the coefficient device.

14 Claims, 4 Drawing Sheets

AUDIO SYSTEM

TECHNICAL FIELD

The present invention relates to an audio system for selectively outputting sounds from a plurality of audio sources, and particularly to an audio system capable of carrying out volume control smoothly when changing selection of the audio source.

BACKGROUND ART

Generally, as for an audio system including a plurality of audio sources such as a radio, cassette player and CD player, a user must carry out volume control every time he or she selects the audio source to adjust the volume of a speaker at a desired level. In other words, since the volume level varies in accordance with the audio source, the user must perform the volume control every time the audio source is selected, and the volume control is usually troublesome.

To eliminate such trouble as the volume control, there is an apparatus, for example, which compares a set volume level stored in a volume level memory circuit with a volume level of an audio signal detected by a volume level detecting circuit, and controls a volume control circuit in response to the difference. In this case, a user stores the set volume level into the volume level memory circuit by setting the volume level of a receiving apparatus such as a television and radio or of an audio system such as a CD player with a volume controller. When the volume level of the audio signal detected by the volume level detecting circuit differs from the set volume level, the volume control circuit is controlled to obtain the sounds of the set volume level (see Patent Document 1, for example).

Furthermore, to obtain the appropriate speaker output without the user's resetting of the volume when the audio source is changed, there is another apparatus which detects the signal level of the input signal with a signal level detecting means, and stores the signal level into a memory means, and which compares the signal level detected by the signal level detecting means with the signal level read from the memory means, and controls the gain of a variable gain means in response to the compared results in such a manner that the speaker output is nearly equalized before and after the change of the audio source (see Patent Document 2, for example).

Patent Document 1: Japanese patent application laid-open No. 6-37563/1994 (pp. 3-5 and FIG. 1-FIG. 7)

Patent Document 2: Japanese patent application laid-open No. 2003-348682 (pp. 3-4 and FIG. 1-FIG. 2)

With the foregoing configurations, the conventional audio systems must store the set volume level in advance, and control the volume control circuit by successively comparing the volume level detected by the volume level detecting circuit with the set volume level. Therefore the conventional audio systems have a problem of not only increasing the load in the control system at the volume control, but also of being very troublesome when the number of the audio sources is large because the user must set their volume levels in advance.

In addition, the conventional audio systems compare the signal level detected by the signal level detecting means with the signal level read from the memory means, and control the gain of the variable gain means in such a manner as to nearly equalize the speaker output before and after the change of the audio source. However, the conventional audio systems have a problem of increasing the load of the control system at the volume control because they must successively compare the signal level detected by the signal level detecting means with the signal level read from the memory means.

The present invention is implemented to solve the foregoing problems. Therefore it is an object of the present invention to provide an audio system that has a plurality of audio sources, and enables a user to carry out the volume control much easier when playing the audio selectively from the plurality of audio sources.

DISCLOSURE OF THE INVENTION

The audio system in accordance with the present invention includes a plurality of audio sources for outputting audio signals different from each other; gain adjusting means for adjusting gain of an audio signal output from each of the audio sources, and for outputting the audio signal; memory means for storing, as internal gains, gains to be set in the gain adjusting means in correspondence with the audio sources; and selecting means for selecting one of the audio sources, wherein gain setting means reads from the memory means the internal gain corresponding to the audio source selected by the selecting means, and sets the internal gain to the gain adjusting means.

As described above, the present invention is configured in such a manner as to store gains to be set to the gain adjusting means in correspondence with the audio sources as the internal gains, and to set, when the selecting means selects one of the audio sources, the internal gain corresponding to the audio source selected to the gain adjusting means. Therefore when the audio source is selected with the selecting means, the gain is automatically adjusted to the gain matching the audio source, which offers an advantage of enabling a user to carry out volume control (gain adjustment) very easily.

BEST MODE FOR CARRYING OUT THE INVENTION

The best mode for carrying out the invention will now be described with reference to the accompanying drawings to explain the present invention in more detail.

Embodiment 1

Figure 1:
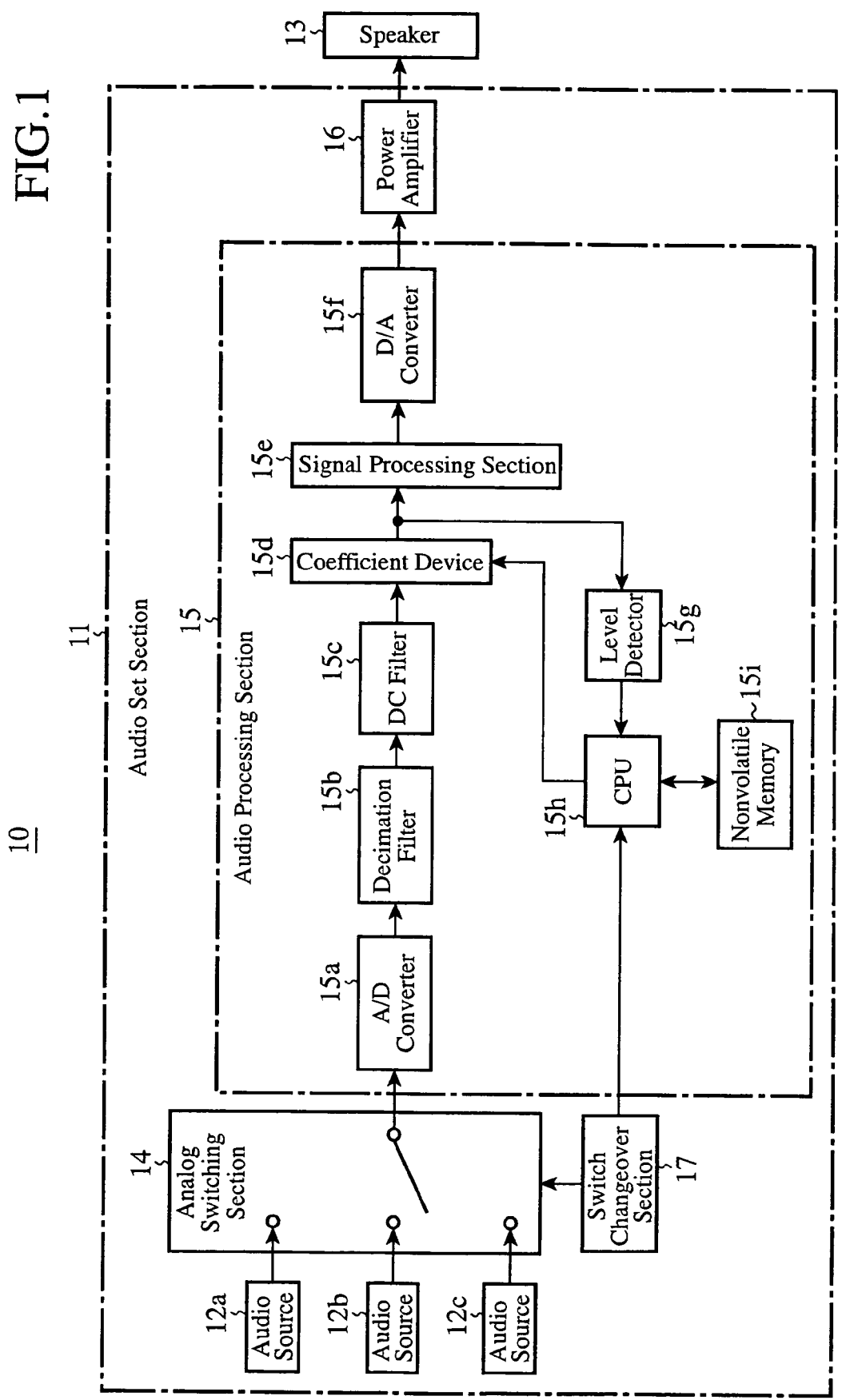
FIG. 1 is a block diagram showing a configuration of an audio system of an embodiment 1 in accordance with the present invention.

FIG. 1 is a block diagram showing a configuration of the audio system of an embodiment 1 in accordance with the present invention. The audio system 10 shown in FIG. 1 is mounted on a vehicle, for example. The audio system 10 includes an audio set section 11 having a plurality of audio sources 12a-12c, and a speaker 13 connected thereto.

In the example shown in FIG. 1, the audio source 12a is a radio receiver, the audio source 12b is a CD player, and the audio source 12c is a cassette player. These audio sources 12a-12c are connected to an audio processing section 15 via an analog switching section (SW) 14. As will be described later, the audio processing section 15 processes the input signal (audio signal) supplied via the SW 14, and outputs it as a processed signal. The processed signal is amplified by a power amplifier 16 and is output from the speaker 13 as the audio.

In the example shown in FIG. 1, the audio processing section 15 includes an A/D converter 15a, decimation filter 15b, DC filter 15c, coefficient device (gain varying device: gain adjusting means) 15d, signal processing section 15e, D/A converter 15f, level detector (level detecting means) 15g, CPU 15h, and nonvolatile memory (memory means) 15i. The SW 14 selectively connects one of the audio sources 12a-12c to the A/D converter 15a in response to the operation of a switch changeover section 17 (the SW 14 and switch changeover section 17 operate as a selecting means). The A/D converter 15a converts the audio signal fed via the SW 14 to a digital signal. The decimation filter 15b thins out unnecessary data from the digital signal, and the DC filter 15c eliminates the DC offset of the A/D converter 15a.

The output signal of the DC filter 15c is subjected to gain adjustment by the coefficient device 15d as will be described later, and to processing such as volume control, tone control and loudness control by the signal processing section 15e, and is converted to an analog audio signal by the D/A converter 15f to be output. The output of the coefficient device 15d is supplied to the level detector 15g that measures the volume level. The volume level is supplied to the CPU 15h. The CPU 15h obtains coefficients to be set to the coefficient device 15d in response to the volume levels of the individual audio sources as will be described later, stores these coefficients into the nonvolatile memory 15i as set coefficients, and controls the coefficient device 15d in response to the set coefficients. The audio processing section 15 described above is composed of a DSP (Digital Signal Processor), for example.

Next, the operation will be described.

Referring to FIG. 1, let us call the gain, which is determined by the A/D converter 15a, decimation filter 15b, DC filter 15c and coefficient device 15d, an internal gain Gab (a and b are numbers greater than zero). The internal gain Gab varies in accordance with the audio sources. On the other hand, let us call the gain, which is determined by the signal processing section 15e, D/A converter 15f and power amplifier 16, a fixed gain Gfix. The fixed gain Gfix is invariable with the audio sources. The gain of the audio set section 11, that is, the total gain of the audio system 10 is Gab×Gfix. The total gain is determined in advance for the individual audio sources.

Incidentally, the audio sources 12a-12c to be actually installed into the audio set section 11 in the manufacturing process of the audio system 10 have an individual difference inevitably. Accordingly, output reference values specified in advance for the individual audio sources 12a-12c often differ from the output values (output levels) of the audio sources 12a-12c actually installed (that is, they have variations). Such variations bring about a condition that the speaker 13 cannot provide desired volume levels for the individual audio sources 12a-12c when the user uses the audio system 10.

Figure 2:
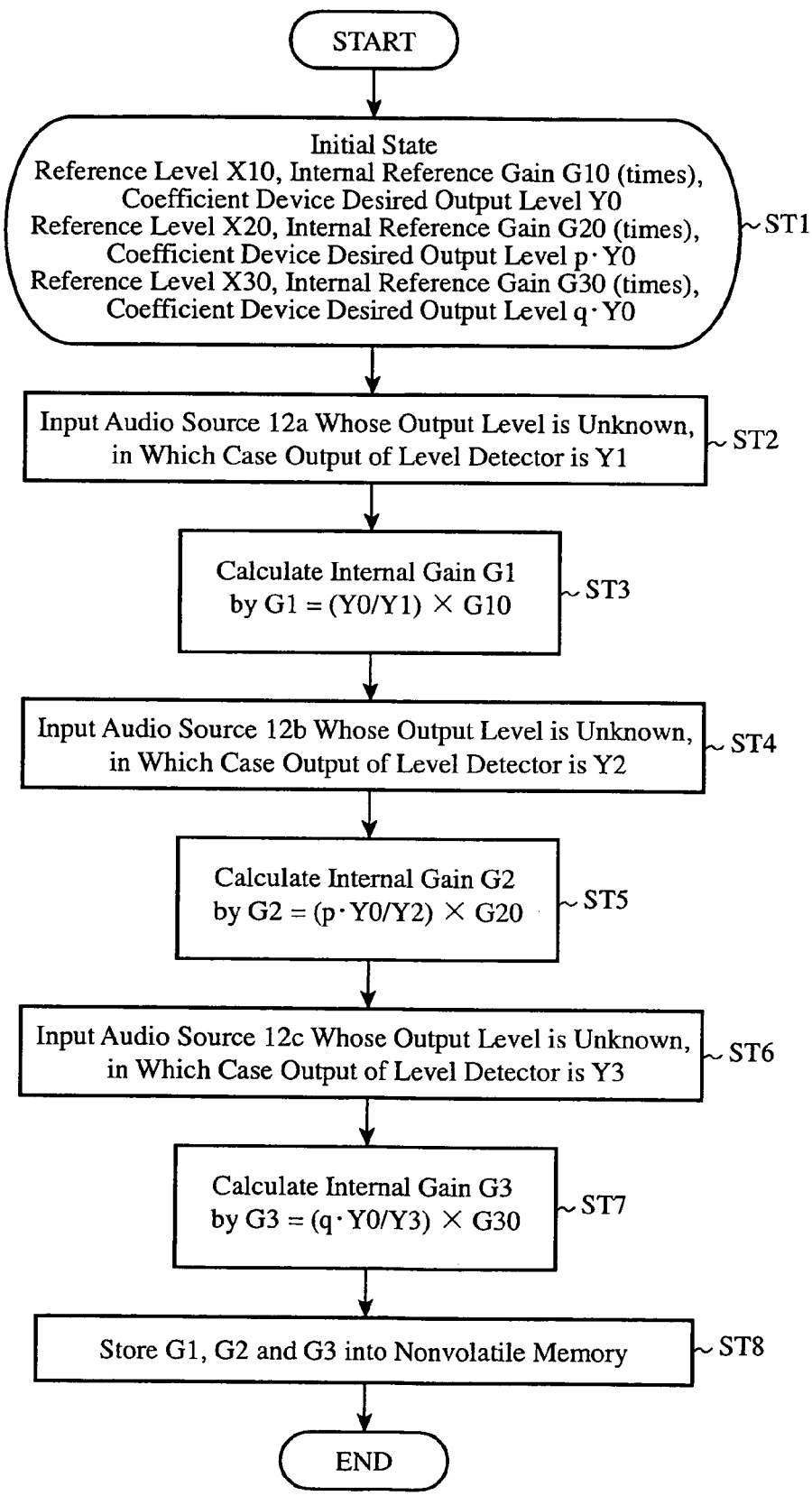
FIG. 2 is a flowchart illustrating the operation of the audio system of the embodiment 1 in accordance with the present invention.
Figure 3:
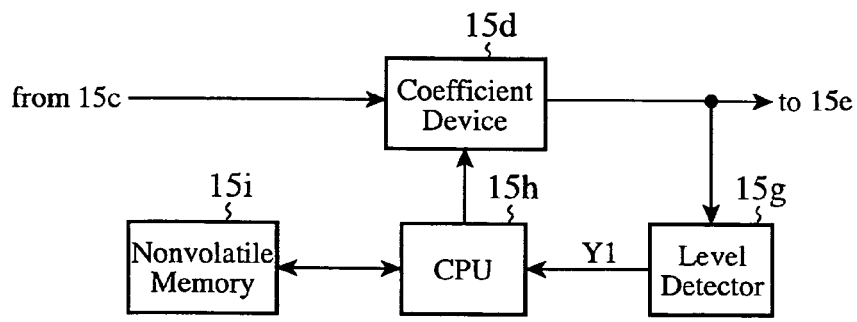
FIG. 3 is a block diagram illustrating the operation of the CPU shown in FIG. 1.

Thus, considering the variations of the individual audio sources in the manufacturing process, coefficients to be set in the coefficient device 15d for the individual audio sources are stored in the nonvolatile memory 15i. Referring to FIG. 2 and FIG. 3 as well, assume that output reference values (reference levels) at the playback of the reference sinusoidal signals of the audio sources 12a-12c are X10, X20 and X30. In addition, assume that internal gains for the reference levels X10, X20 and X30 are G10, G20 and G30.

Furthermore, assume that when the reference levels X10, X20 and X30 are supplied to the audio processing section 15 via the analog switching section 14, the output levels (desired output levels) of the coefficient device 15d are Y0, p·Y0 and q·Y0 (p and q are real numbers greater than zero). The internal gains G10, G20 and G30 and the desired output levels Y0, p·Y0 and q·Y0 are stored, for example, in the nonvolatile memory 15i in advance (step ST1).

As for the audio sources 12a-12c in the audio set section 11, their output levels are unknown. Thus, when the user selects the audio source 12a with the switch changeover section 17, first, the audio source 12a is connected to the audio processing section 15 via the SW 14, and the audio signal from the audio source 12a is supplied to the audio processing section 15. In this case, the switch changeover section 17 supplies the CPU 15h with the audio selecting signal indicative of the selection of the audio source 12a.

As described before, the coefficient device 15d supplies its output signal to the level detector 15g that detects the output level. Assume that the output level is Y1 (step ST2). Detecting from the audio selecting signal that the audio source 12a is selected, the CPU 15h accesses the nonvolatile memory 15i, reads the internal gain G10 and desired output level Y0 corresponding to the audio source 12a, and obtains the coefficient (internal gain) G1 for adjusting the output level Y1 to the desired output level Y0.

Assume that the output level of the audio source 12a is X1 as shown in FIG. 3 (in FIG. 3, the input level to the coefficient device 15d is represented as X1 for convenience sake), then the internal gain G10=Y0/X10 and X1×G10=Y1. In addition, since X1×G1=Y0, G1=(Y0/Y1)×G10 holds. Thus, the CPU 15h obtains the internal gain G1=(Y0/Y1)×G10 for adjusting the output level Y1 to the desired output level Y0 (step ST3).

Likewise, when the user selects the audio source 12b with the switch changeover section 17, the audio source 12b is connected to the audio processing section 15 via the SW 14, and the audio signal from the audio source 12b is supplied to the audio processing section 15. In this case, the switch changeover section 17 supplies the CPU 15h with the audio selecting signal indicative of the selection of the audio source 12b.

Assume that the output level detected by the level detector 15g is Y2 (step ST4). Detecting from the audio selecting signal that the audio source 12b is selected, the CPU 15h accesses the nonvolatile memory 15i, reads the internal gain G20 and desired output level p·Y0 corresponding to the audio source 12b, and obtains the internal gain G2 for adjusting the output level Y2 to the desired output level Y0. In other words, the CPU 15h obtains the internal gain G2=(p·Y0/Y2)×G20 for adjusting the output level Y2 to the desired output level Y0 (step ST5).

In addition, when the user selects the audio source 12c with the switch changeover section 17, the audio source 12c is connected to the audio processing section 15 via the SW 14, and the audio signal from the audio source 12c is supplied to the audio processing section 15. In this case, the switch changeover section 17 supplies the CPU 15h with the audio selecting signal indicative of the selection of the audio source 12c. Assume that the output level detected by the level detector 15g is Y3 (step ST6).

Detecting from the audio selecting signal that the audio source 12c is selected, the CPU 15h accesses the nonvolatile memory 15i, reads the internal gain G30 and desired output level q·Y0 corresponding to the audio source 12c, and obtains the internal gain G3 for adjusting the output level Y3 to the desired output level Y0. In other words, the CPU 15h obtains the internal gain G3=(q·Y0/Y3)×G30 for adjusting the output level Y3 to the desired output level Y0 (step ST7).

In this way, the CPU 15h obtains the internal gains G1-G3 corresponding to the audio sources 12a-12c, and stores the internal gains G1-G3 into the nonvolatile memory 15i (step ST8) In this case, the internal gains G10, G20 and G30 and the desired output levels Y0, p·Y0 and q·Y0, which have been stored in the nonvolatile memory 15i in advance, are erased.

After storing the internal gains G1-G3 into the nonvolatile memory 15i as described above, the audio system is powered-off and shipped. When the audio system is subsequently powered-up and the user wishes to listen to the audio signal from the audio source 12a using the audio system 10, he or she connects the audio source 12a to the audio processing section 15 via the SW 14 by operating the switch changeover section 17. The CPU 15h, detecting from the audio selecting signal that the audio source 12a is selected, sets the coefficient device 15d at the internal gain G1.

Likewise, when the user selects the audio source 12b with the switch changeover section 17, the CPU 15h sets the internal gain G2 to the coefficient device 15d. In addition, when the user selects the audio source 12c with the switch changeover section 17, the CPU 15h sets the internal gain G3 to the coefficient device 15d. As is clear from the foregoing explanation, the CPU 15h functions as a gain setting means and gain storing means.

As described above, the present embodiment 1 is configured in such a manner that it stores the internal gains for the individual audio sources 12a-12c into the nonvolatile memory 15i in advance; and when one of the audio sources is selected with the switch changeover section 17, it reads from the nonvolatile memory 15i the internal gain corresponding to the audio source selected, and sets the internal gain to the coefficient device 15d. Therefore the present embodiment 1 offers an advantage of enabling the user to carry out the volume control (gain adjustment) very easily because the internal gain is automatically adjusted to that matching to the audio source.

Furthermore, the present embodiment 1 is configured in such a manner that it determines the internal gains to be used as the references for the individual audio sources 12a-12c as the reference internal gains, and determines the output levels of the coefficient device 15d as the desired output levels; and that it obtains the internal gains for the individual audio sources in response to the output levels detected by the level detector 15g and to the reference internal gains and desired output levels, and stores the internal gains into the nonvolatile memory 15i. Therefore, even if the audio sources 12a-12c installed into the audio systems have the variations, the nonvolatile memory 15i stores the internal gains taking account of the variations. Accordingly, the present embodiment offers an advantage of being able to achieve the desired output level for the individual audio sources without fail in any audio systems.

Embodiment 2

Referring to FIG. 1, the output level adjustment will now be described at the switching from the audio source, whose audio signal is listened to at present, to another audio source. It is assumed in the embodiment 2 that although the CPU has functions different from those of the embodiment 1, it is denoted by the same reference symbol for convenience of explanation, and that the nonvolatile memory 15i stores the internal gains corresponding to the audio sources 12a, 12b and 12c.

Figure 4:
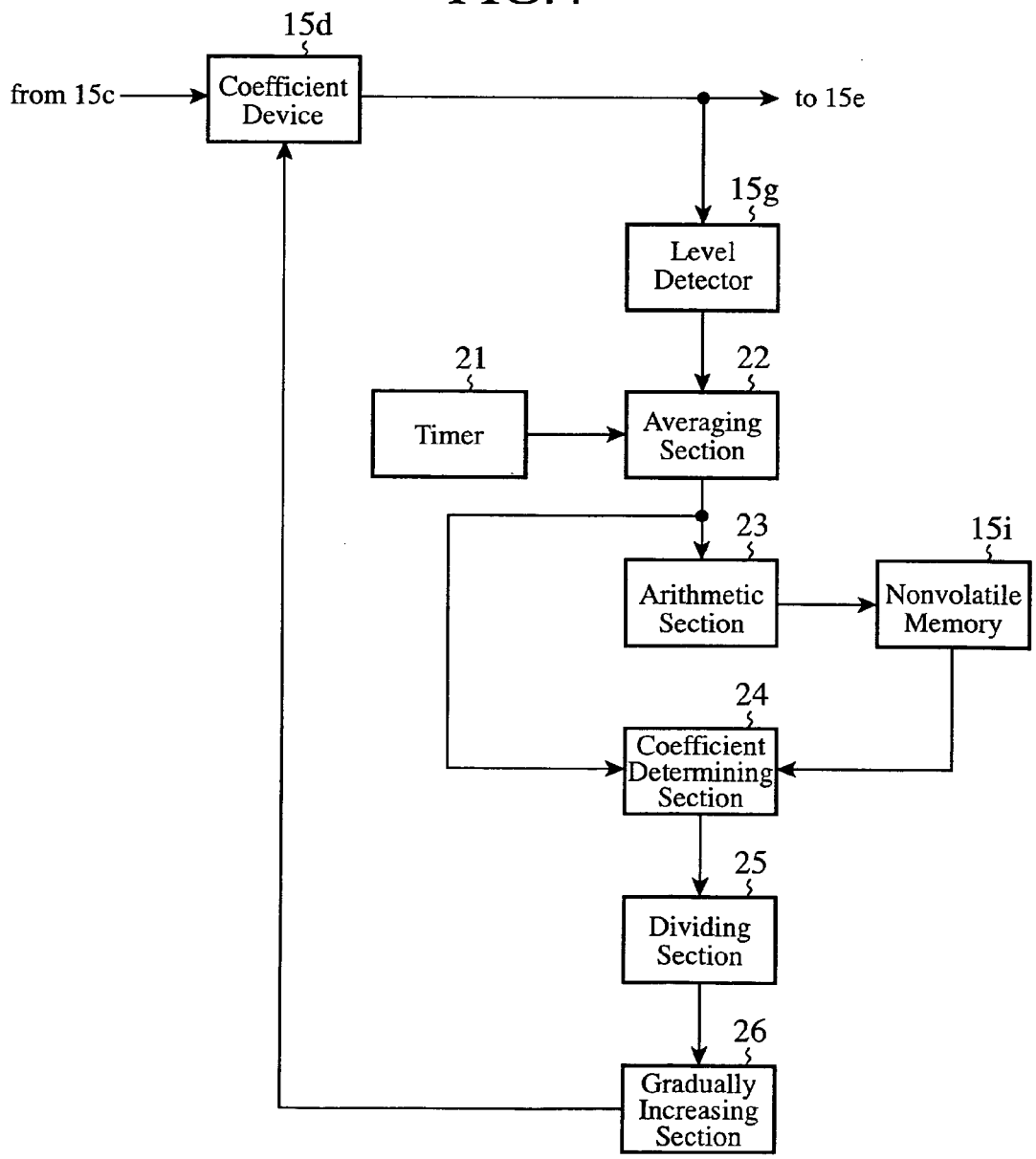
FIG. 4 is a diagram showing functional blocks of the CPU in the audio system of an embodiment 2 in accordance with the present invention.
Figure 5:
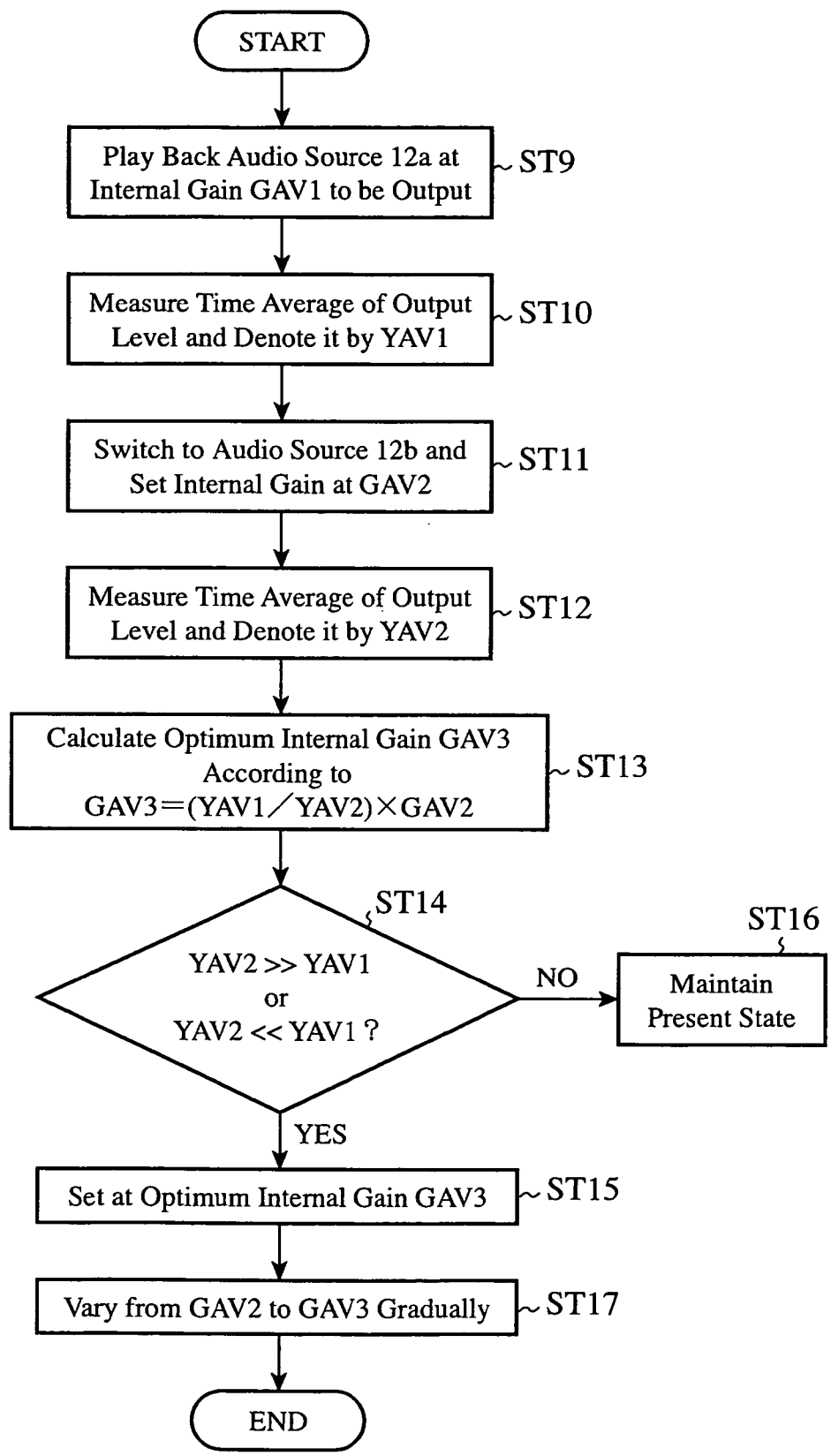
FIG. 5 is a flowchart illustrating the operation of the audio system of the embodiment 2 in accordance with the present invention.

Referring to FIG. 4 and FIG. 5, the CPU 15h includes a timer 21, averaging section (averaging means) 22, arithmetic section (arithmetic means) 23, coefficient determining section (gain determining means) 24, dividing section 25, and gradually increasing section (gain setting varying means) 26 as shown in FIG. 4. Assume that the internal gain is GAV1 while the audio signal output from one of the audio sources 12a-12c is listened to (for example, the audio signal output from the audio source 12a is listened to), and that the user plays back and listens to it at the volume level corresponding to the internal gain GAV1 (step ST9).

In this case, the coefficient device 15d supplies its output signal to the level detector 15g that detects the output level (that is, the first output level). Receiving the output level from the level detector 15g, the CPU 15h starts the timer 21 to count a preset period of time. The averaging section 22 calculates the time average value of the output level from the start to time-up of the timer 21, and sets the time average value as a measured value YAV1 (step ST10).

If the user switches the audio source from the audio source 12a to the audio source 12b, the CPU 15h sets the internal gain (GAV2) corresponding to the audio source 12b into the coefficient device 15d (switching of the internal gain: step ST11). When switched from the audio source 12a to the audio source 12b, the timer 21 is started to count the preset time period. The averaging section 22 calculates the time average value of the output level (that is, the second output level) of the coefficient device 15d from the start to the time-up of the timer 21, and sets the time average value as a measured value YAV2 (step ST12).

Subsequently, the CPU 15h has the arithmetic section 23 obtain the optimum internal gain GAV3 (step ST13). In other words, the arithmetic section 23 calculates GAV3=(YAV1/YAV2)×GAV2, and stores the optimum internal gain GAV3 into the nonvolatile memory 15i. After that, the coefficient determining section 24 compares the output level YAV2 with the output level YAV1. When the difference (absolute value) between the two exceeds a preset threshold level, that is, when the difference is large (YAV2>>YAV1 or YAV2<<YAV1: step ST14), the coefficient determining section 24 determines the internal gain at the optimum internal gain GAV3 (step ST15). On the other hand, when the difference is equal to or less than the preset threshold level, the coefficient determining section 24 maintains the internal gain at GAV2 (keeps the current state: step ST16).

To prevent an uncomfortable feeling due to a sudden change of the internal gain when changing the internal gain from the internal gain GAV2 to the optimum internal gain GAV3, the dividing section 25 calculates a quotient obtained by dividing the difference (GAV3−GAV2) by a preset number. For example, assume that GAV3−GAV2=6 dB (absolute value), and the preset number is 10. In this case, the dividing section 25 calculates 6/10=0.6 dB, and delivers the quotient to the gradually increasing section 26. Then the gradually increasing section 26 augments the internal gain to be set to the coefficient device 15d at a quotient (0.6 dB) step at every predetermined interval (one second, for example). Thus, the CPU 15h gradually varies the internal gain from GAV2 to GAV3 (step ST17).

As described above, the present embodiment 2 is configured in such a manner that when the second audio source other than the selected audio source is selected by the switch changeover section 17 while one of the audio sources 12a-12c is selected as the selected audio source, the present embodiment 2 calculates the optimum internal gain in response to the output level (first output level) of the selected audio source, to the output level (second output level) of the second audio sources and to the internal gain corresponding to the second audio source; and that when the difference between the first and second output levels exceeds the predetermined threshold value, the present embodiment 2 selects the optimum internal gain in place of the internal gain corresponding to the second audio source. Thus, the internal gain is determined considering the output level of the previous audio source (selected audio source) and the output level of the audio source after the switching (second audio source) when the audio source is changed. Therefore the present embodiment 2 offers an advantage of being able to reduce the uncomfortable feeling of the user due to the volume changes at the switching of the source.

In addition, the present embodiment 2 is configured in such a manner that when the internal gain corresponding to the audio source after the switching is changed to the optimum internal gain at the switching of the audio source, the present embodiment 2 calculates the quotient by dividing the difference between the optimum internal gain and the internal gain corresponding to the audio source by the preset numerical value, and varies the internal gain to be set to the coefficient device 15d at the quotient step at every predetermined time interval. Accordingly, the present embodiment 2 offers an advantage of being able to reduce the uncomfortable feeling due to the sudden change of the internal gain.

INDUSTRIAL APPLICABILITY

As described above, the audio system in accordance with the present invention is suitable for carrying out volume control smoothly when playing back the audio selectively from a plurality of audio sources.

What is claimed is:

1. An audio system comprising:
a plurality of audio sources for outputting audio signals different from each other;
a gain adjusting device for adjusting gain of an audio signal output from each of said audio sources, and for outputting the audio signal;
a non-volatile memory for storing, as internal gains, predetermined gains to be set in said gain adjusting device in correspondence with said audio sources;
a selecting device for selecting one of said audio sources; and
a processing device for reading from said non-volatile memory the internal gain corresponding to the audio source selected by said selecting device, and for setting the internal gain in said gain adjusting device,
wherein said predetermined gains are stored in said non-volatile memory in such manner as to be available for use after a subsequent power-up of the processing device,
wherein each of said predetermined gains is calculated by performing a level detection of the output level of the corresponding audio source only once, and
wherein each of the predetermined gains remains unchanged while recurrently set as the internal gain of the gain adjusting device in response to the corresponding audio source being selected after subsequent power-ups of the processing device.

2. The audio system according to claim 1, wherein:
a reference gain is determined in advance for each of said audio sources,
said gain adjusting device is configured to determine the output level for the outputted audio signal based on a desired output level,
said system further comprises a level detecting device for detecting an output level of said gain adjusting device, and
said processing device is configured to:
calculate the internal gain of each of said audio sources according to: the output level detected by said level detecting device, the reference gain, and the desired output level; and
store the internal gain in said non-volatile memory.

3. The audio system according to claim 1, wherein
the selected audio source is switched from a first one of said plurality of audio sources to a second one of said plurality of audio sources,
said system further comprises a level detecting device for detecting an output level of said gain adjusting device, the level detecting device detecting a first output level when the first audio source is selected, and
in response to the switch from the first audio source to the second audio source, said processing device is configured to:
calculate an optimum internal gain in accordance with: the first output level associated with the first audio source as detected by said level detecting device, a second output level associated with the second audio source, and the internal gain corresponding to the newly-selected audio source; and
if the difference between the first output level and the second output level exceeds a predetermined threshold value, change the setting in the gain adjusting device from the internal gain corresponding to the second audio source to the optimum internal gain.

4. The audio system according to claim 3, wherein:
said level detecting device further detects a second output level when the second audio source is selected,
said processing device is configured to calculate, in a preset time period, time averages of the first and second output levels detected by said level detecting device, respectively, and
substitute the time averages for the first output level and the second output level, respectively.

5. The audio system according to claim 3, wherein
when changing the setting from the internal gain corresponding to the newly-selected audio source to the optimum internal gain, the processor is configured to gradually vary the internal gain to the optimum internal gain by setting in said gain adjusting device at predetermined time intervals a quotient obtained by dividing the difference between the optimum internal gain and the internal gain corresponding to the newly-selected audio source by a preset value.

6. A method implemented in an audio system including a plurality of audio sources for outputting audio signals different from each other, comprising:
storing in a non-volatile memory device, internal gains corresponding to said audio sources as determined by a processor in said audio system; and
after the internal gains are stored in the non-volatile memory and a subsequent power-up of the processor occurs, performing the following:
selecting one of said audio sources as the source of the audio signal output of the audio system;
reading from said non-volatile memory device, the internal gain corresponding to the selected audio source; and adjusting a gain of the audio signal output of the audio system according to the read internal gain, wherein each of said internal gains is calculated by performing a level detection of the output level of the corresponding audio source only once, and wherein each of the internal gains remains unchanged while recurrently used to adjust the gain of the audio signal output in response to the corresponding audio source being selected after subsequent power-ups of the processing device.

7. The method of claim 6, wherein the output level for the outputted audio signal is dependent upon a desired output level, the method further comprising:

determining a reference gain in advance for each of said plurality of audio sources;

detecting the output level for the outputted audio signal;

calculating the internal gain of each of said audio sources according to: the output level detected by said level detecting device, the reference gain, and the desired output level; and storing the internal gain in said non-volatile memory device.

8. The audio system according to claim 6, wherein the selected audio source is switched from a first one of said plurality of audio sources to a second one of said plurality of audio sources, the method further comprising:

detecting a first output level for the outputted audio signal when the first audio source is selected; and in response to the switch from the first audio source to the second audio source, calculating an optimum internal gain in accordance with: the detected first output level, a second output level associated with the second audio source, and the internal gain corresponding to the second audio source; and when the difference between the detected first output level and the second output level exceeds a predetermined threshold value, changing the adjusted internal gain from the internal gain corresponding to the second audio source to the optimum internal gain.

9. The method according to claim 8, further comprising:

detecting a second output level when the second audio source is selected;

calculating, according to a preset time period, time averages of the detected first and second output levels, respectively, and substituting the calculated time averages for the detected first and second output levels, respectively.

10. The method according to claim 8, wherein the adjusted gain is changed from the internal gain corresponding to the second audio source to the optimum internal gain by:

gradually varying the adjusted gain at predetermined time intervals by a quotient obtained by dividing the difference between the optimum internal gain and the internal gain corresponding to the second audio source by a preset value.

11. The audio system according to claim 1, wherein the audio system is a mounted audio system, and the audio sources are installed within the mounted audio system.

12. The audio system according to claim 1, wherein the audio system is mounted on a vehicle, and the audio sources are installed within the vehicle-mounted audio system.

13. The method according to claim 6, further comprising:

after the internal gains are stored in the non-volatile memory, installing the audio sources and a device including the processor and the non-volatile memory in a mounted audio system.

14. The method according to claim 6, further comprising:

after the internal gains are stored in the non-volatile memory, installing the audio sources and a device including the processor and the non-volatile memory in a vehicle-mounted audio system.

* * * * *